(12) United States Patent
Bae et al.

(10) Patent No.: US 6,878,580 B2
(45) Date of Patent: Apr. 12, 2005

(54) SEMICONDUCTOR DEVICE HAVING GATE WITH NEGATIVE SLOPE AND METHOD FOR MANUFACTURING THE SAME

(75) Inventors: Geum-jong Bae, Suwon (KR); Nae-in Lee, Seoul (KR); Ki-chul Kim, Suwon (KR); Hwa-sung Rhee, Seoul (KR); Sang-su Kim, Suwon (KR); Jung-il Lee, Gimcheon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/341,563

(22) Filed: Jan. 13, 2003

(65) Prior Publication Data

US 2003/0227055 A1 Dec. 11, 2003

(30) Foreign Application Priority Data

Jun. 5, 2002 (KR) ........................................ 2002-31680

(51) Int. Cl.$^7$ .......................................... H01L 21/8234
(52) U.S. Cl. ................. 438/198; 438/588; 257/E21.182
(58) Field of Search ................................ 438/198, 588; 257/E21.182

(56) References Cited

U.S. PATENT DOCUMENTS 6,373,112 B1 * 4/2002 Murthy et al. .............. 257/407
6,551,941 B2 * 4/2003 Yang et al. .................. 438/714
6,605,543 B1 * 8/2003 Zheng ......................... 438/710
2002/0155566 A1 * 10/2002 Doris et al. ................. 438/279

FOREIGN PATENT DOCUMENTS

KR        2003000485 A   *   1/2003   ......... H01L/21/336

OTHER PUBLICATIONS

IBM Technical Disclosure Bulletin, Jun. 1991, US.*

* cited by examiner

*Primary Examiner*—George Fourson
*Assistant Examiner*—Thanh V Pham
(74) *Attorney, Agent, or Firm*—F. Chau & Associates, LLC

(57) ABSTRACT

A semiconductor device having a gate with a negative slope and a method of manufacturing the same. A poly-SiGe layer with a Ge density profile which decreases linearly from the bottom of the gate toward the top of the gate is formed and a poly-SiGe gate having a negative slope is formed by patterning the poly-SiGe layer. It is possible to form a gate whose bottom is shorter than its top defined by photolithography by taking advantage of the variation of etching characteristics with Ge density when patterning. Accordingly, the gate is compact enough for a short channel device and gate resistance can be reduced.

15 Claims, 5 Drawing Sheets

SEMICONDUCTOR DEVICE HAVING GATE WITH NEGATIVE SLOPE AND METHOD FOR MANUFACTURING THE SAME

BACKGROUND OF THE INVENTION

1. Field of the Invention

The present invention relates, generally, to a semiconductor device and a manufacturing method thereof. More particularly, the present invention is directed to a semiconductor device having a gate that has a bottom portion that is narrower than its top portion, and a method for manufacturing the same.

2. Discussion of the Related Art

As semiconductor devices become more highly integrated, the sizes of and distances between individual devices within a semiconductor device decrease. Conventional techniques for manufacturing semiconductor devices usually involve photoresist trimming and hard mask shrinking for patterning a polycrystalline silicon gate having a narrow line width. In the conventional art, gate patterning is performed using a narrowly formed mask. A gate formed by this method has a rectangular section whose length at the top and length at the bottom are almost the same. Therefore, in a short channel device the length of the top of the gate and the length of the bottom of the gate are both short.

In the production of devices required for high-speed operation, a silicide process is usually used to reduce the gate resistance. In such a silicide process, a silicide layer with a low resistance is formed by layering metals such as titanium (Ti), tungsten (W), molybdenum (Mo), tantalum (Ta), cobalt (Co), nickel (Ni), etc. on a polycrystalline silicon gate and reacting the metals with silicon using a thermal process. If the length of the top of the gate decreases, the volume of an area where the silicide layer will be formed also decreases. Thus, the gate resistance is significantly increased and becomes a problem. For example, if a device has a gate length of 100 nm, the degradation of on-wafer variation (OWV) and on-chip variation (OCV) of the gate length becomes severe.

To overcome the above problem, a notched gate has been suggested. Since, in a notched gate, the top of the gate is longer than the bottom of the gate, it is possible to manufacture a smaller short channel device with the same photolithography technology. In addition, it is possible to increase the gate sheet resistance of a notched gate compared to a general rectangular gate having the same length at its top and bottom. The notched gate is embodied more effectively when using a gate stack made of polycrystalline silicon and silicon germanium, and has the advantage of decreasing OWV and OCV degradation.

FIG. 1 is a cross-sectional view of a notched gate in a general MOSFET structure after patterning. As shown in FIG. 1, if a T-shaped notched gate 20 is formed by forming a gate dielectric layer 15 on a semiconductor substrate 10, then an ion implantation 40 is used to form a source and a drain, the ion implantation is shadowed by the gate edge 50.

Accordingly, an offset 80 occurs between the bottom gate edge 60 and the source/drain ion implantation region 70. This phenomenon has the advantage of reducing excess overlap of the gate and a source/drain extension (SDE) in the subsequent thermal process. However, if the overlap between the gate and the SDE region is not sufficient, the driving current is considerably reduced and the speed of switching operations of the device is decreased. Recently, shallower source/drain regions are required for deterring a short channel effect, which becomes more prominent as the size of a device decreases, and the thermal process for activating the implanted ions is used to proceed in a direction such that ion diffusion can be deterred as much as possible. Accordingly, a problem of insufficient overlap between a gate and a source/drain in a notched gate arises.

To overcome the above problem, highly oblique ion implantation is required, but the ion implantation angle is limited in a high-density device within which the interval between gates is narrow.

SUMMARY OF THE INVENTION

A need therefore exits for a semiconductor device with a gate, wherein the bottom of the gate is narrower than the top of the gate to reduce gate resistance. In addition, the shape of the gate can be transformed to prevent ion implantation from being shadowed by the edges of the gate when ions are implanted to form a source/drain region.

A method is provided for manufacturing a semiconductor device in which the shape of a gate is easily controlled to have the bottom of the gate narrower than top of the gate, with a high reproducibility.

One aspect of the present invention provides a semiconductor device including a poly-SiGe gate on a semiconductor substrate, with a gate dielectric layer therebetween, wherein the bottom of the poly-SiGe gate is narrower than the top of the gate by having negatively sloping sides. The bottom of the gate may be narrower than the top of the gate by about 10 nm to about 80 nm.

In a semiconductor device according to another aspect of the present invention, the Ge density is greater at the bottom of the gate than at the top of the gate, and the Ge density decreases linearly toward the top of the gate. Preferably, the Ge density ranges from about 30 at % to about 50 at % at the bottom of the gate and from 0 to about 10 at % at the top of the gate. Alternatively, the Ge density in the gate may be uniform throughout the entire gate.

Another aspect of the present invention provides a method for manufacturing a semiconductor device comprising forming a gate dielectric layer on a semiconductor substrate. Next, a silicon seed layer is formed on the gate dielectric layer. Then, a poly-SiGe layer is formed by flowing Si source gas and Ge source gas on the seed layer at the same time, wherein the poly-SiGe layer has a Ge density gradient created by decreasing the amount of the Ge source gas. Next, a gate is formed by patterning the poly-SiGe layer, wherein the bottom of the gate is narrower than the top of the gate with negatively sloping sides. In addition, the gate formed by patterning the poly-SiGe layer uses the characteristic that the portion of the poly-SiGe with a greater Ge density etches at a faster rate than the portion of the poly-SiGe layer having a lower Ge density. Finally, a source/drain regions are formed on the semiconductor device at both sides of the gate by implanting impurities on the resultant structure on which the gate is formed.

In the above-described method, preferably, the patterning of the poly-SiGe layer includes: pre-etching using gas including $CF_4$ and $Cl_2$; main-etching using gas including HBr, $Cl_2$, He and $O_2$; and over-etching using gas HBr, $Cl_2$, He, $O_2$ and $N_2$.

The seed layer may be formed of polycrystalline silicon or amorphous silicon.

The method may further include forming a silicon capping layer on the poly-SiGe layer after the formation of the poly-SiGe layer.

Preferably, the Ge density in the poly-SiGe layer is greater at the bottom of the gate than at the top of the gate, and the Ge density of the gate decreases linearly toward the top of the gate. The Ge density in the gate may range from about 30 at % to about 50 at % at the bottom of the gate, and ranges from 0 to about 10 at % at the top of the gate.

Preferably, the method further includes performing a thermal process on the resultant structure on which the gate is formed to make the germanium density uniform throughout the entire gate.

To solve the problem of existing notched gates, a gate structure having a negative slope is provided such that the gate length is gradually reduced from the top of the gate to the bottom, and a method for manufacturing the same.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

Figure 1:
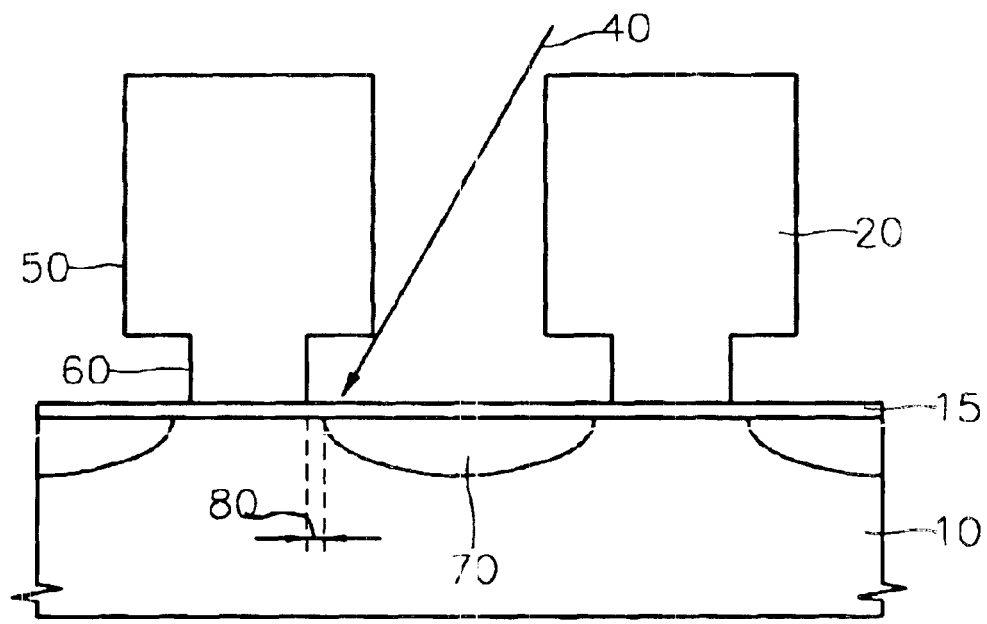
FIG. 1 is a cross-sectional view of a notched gate in a general MOSFET structure after patterning.

The present invention will now be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions may be exaggerated for clarity. Also, the same reference numerals in different drawings represent the same elements.

The present invention relates to a gate having a negative slope such that the gate length decreases from the gate top toward the gate bottom. This gate may be embodied by a polycrystalline silicon germanium (poly-SiGe) layer structure having a Ge density gradient which increases from the gate top toward the gate bottom.

Figure 2:
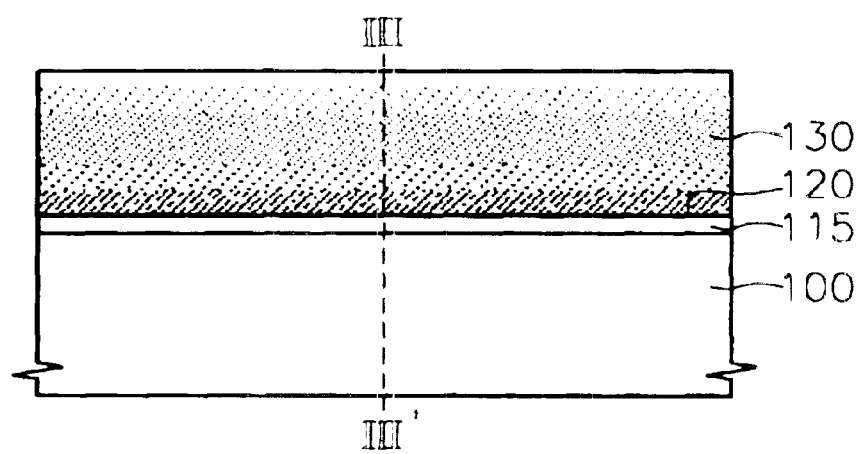
FIG. 2 is a cross-sectional view for describing a method for manufacturing a semiconductor device, according to an embodiment of the present invention.

FIG. 2 is a cross-sectional view for describing a method for manufacturing a semiconductor device, according to one aspect of the present invention. Referring to FIG. 2, a gate dielectric layer 115 is formed on a semiconductor substrate 100. A thin thermal oxide layer can be grown as the gate dielectric layer 115 on the semiconductor substrate 100. Next, a seed layer 120 formed of polycrystalline silicon or amorphous silicon with a thickness less than 5 nm is deposited. The temperature for depositing a seed layer can range from 450° C. to 580° C. and the deposition is performed by LPCVD (Low-Pressure Chemical Vapor Deposition), or any other suitable method.

Next, a poly-SiGe layer 130 with a Ge density gradient is formed on the seed layer 120. The poly-SiGe layer 130 is deposited by flowing Si source gas and Ge source gas at the same time, but the amount of Ge source gas is gradually reduced to produce the Ge density gradient. The deposition of the poly-SiGe layer 130 can be performed by LPCVD. $SiH_4$ or $Si_2H_6$ can be used as Si source gas and $GeH_4$ can be used as Ge source gas. The thickness of the poly-SiGe layer 130 can range from 100 to 200 nm. The seed layer 120 is formed such that Ge does not gather at the interface between the seed layer 120 and the poly-SiGe layer 130.

The Ge density decreases from a high density (about 30 at % to about 50 at %) to a low density (0 to about 10 at %). The Si and Ge density profiles may be straight or curved lines.

The present invention will now be described with reference to exemplary process conditions for forming the poly-SiGe layer 130. It is noted that the present invention is not limited to the embodiment described below. Here, a deposition is performed by LPCVD, $SiH_4$ or $Si_2H_6$ is used as Si source gas and $GeH_4$ is used as Ge source gas, and $H_2$ is used as carrier gas. The process pressure ranges from about 10 mTorr to about 100 Torr, and the process temperature ranges from 500° C. to 600° C. $H_2$ has a gas flow rate ranging from about 100 to about 2000 sccm, and the gas flow rates of $GeH_4/SiH_4$ start at about 70/100 sccm and finally become about 0/100 sccm by linearly reducing the flow rate of $GeH_4$. The bottom of the resulting gate has a Ge density of about 30 at % and the top of the gate has a Ge density of about 0 at %. In addition, it is noted that the greater the $GeH_4$ flow rate is, the faster the poly-SiGe is deposited. Thus, the Ge density profile can be a straight line or a curved line depending on the rate at which the $GeH_4$ flow rate is reduced.

Figure 3A:
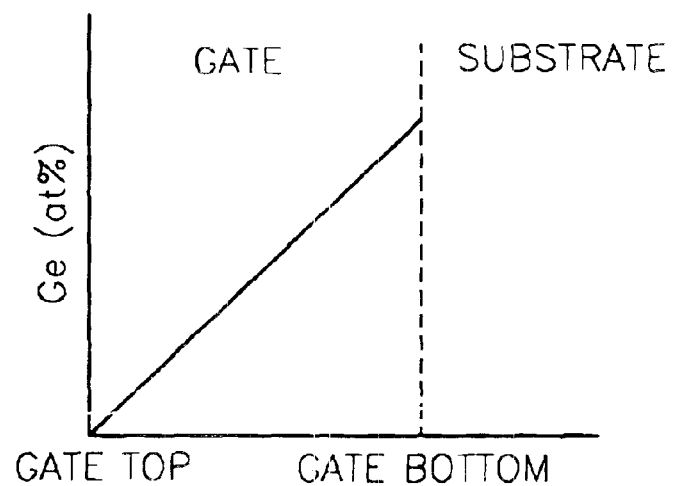
FIGS. 3A and 3B show Ge density profiles in the polycrystalline silicon germanium (poly Si—Ge) layer 130 shown in FIG. 2, and correspond to the cross-section taken along line III–III'.
Figure 3B:
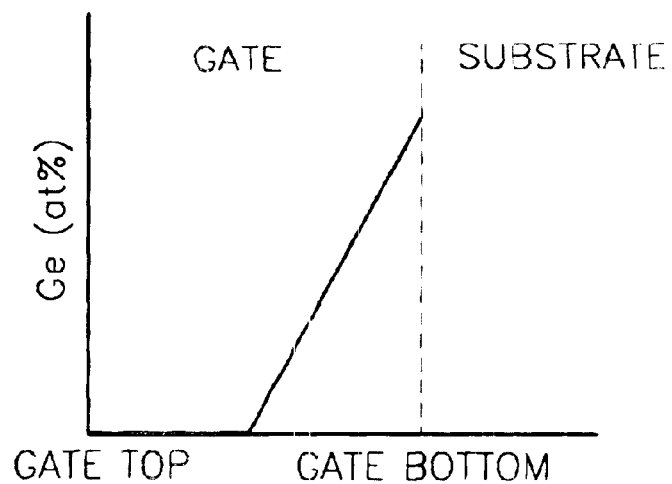

FIGS. 3A and 3B show Ge density profiles in the poly-SiGe layer 130, as shown in FIG. 2, that corresponds to the cross-section taken along line III–III'. According to another aspect of the present invention, the shape of a gate is determined by the Ge density profile.

FIG. 3A shows Ge density decreasing linearly from the bottom to the top of the gate.

FIG. 3B shows Ge density decreasing linearly from the bottom toward the top of the gate until the density becomes about 0 at %, wherein the Ge density is maintained at about 0 at % at the top of the gate. This profile is obtained by depositing poly-SiGe with a Ge density gradient and forming a silicon capping layer, as shown in FIG. 2.

Figure 4A:
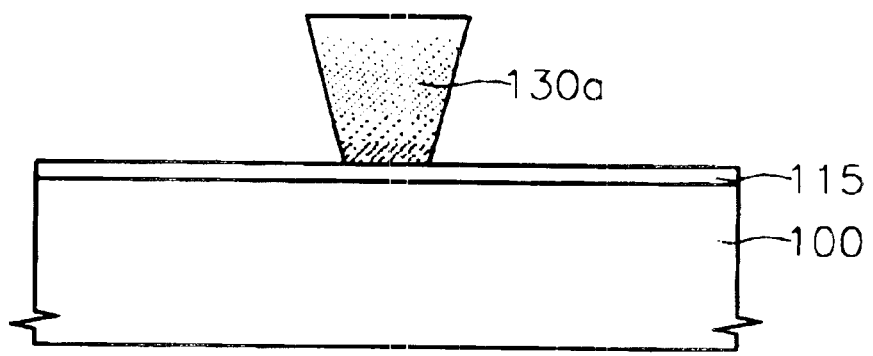
FIGS. 4A, 5A and 6A are cross-sectional views for describing a method for manufacturing a semiconductor device according to an embodiment of the present invention.
Figure 4B:
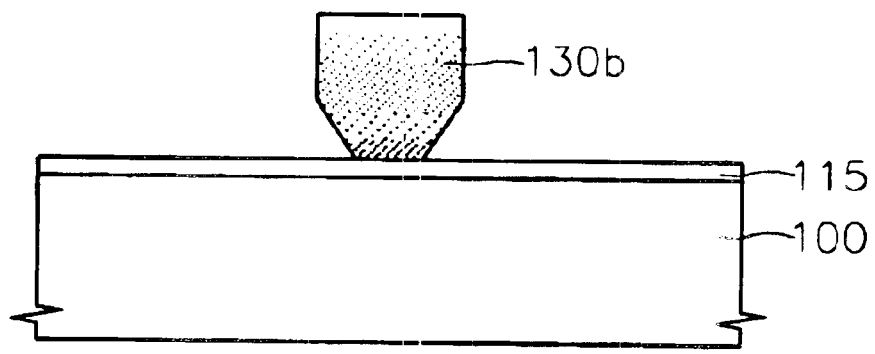
FIGS. 4B, 5B and 6B are cross-sectional views for describing a method for manufacturing a semiconductor device according to another embodiment of the present invention.

After the poly-SiGe layer 130 with a Ge density gradient has been formed, a gate with negative sloping sides is formed by patterning the poly-SiGe layer 130 using the characteristic that the poly-SiGe layer with a greater Ge density etches at a faster rate than the portion of the poly-SiGe layer with a lower Ge density. FIG. 4A shows a gate 130a with a negative slope obtained by the Ge density profile shown in FIG. 3a. FIG. 4B shows a gate 130b with a negative slope obtained by the Ge density profile shown in FIG. 3b.

Below, a method for patterning the poly-SiGe layer 130 by etching is described. However, it is noted that the present invention is not limited to the embodiment described below.

First, a photoresist pattern is formed on a poly-SiGe layer, and the portion of the poly-SiGe layer that is not protected by the photoresist pattern is pre-etched using a gas such as $CF_4$, $Cl_2$, or combination thereof. The process pressure may be maintained at about 4 mTorr, the source power may be 600 W, and the bias power may be 60 W, and about 100 sccm $CF_4$ and about 10 to about 20 sccm $Cl_2$ are provided. The duration of pre-etching is set to be about 1/10 of the entire etching time.

Next, the portion of the poly-SiGe layer which is not protected by the photoresist pattern is main-etched using a gas including HBr, $Cl_2$, He, $O_2$, or any combination thereof. The process pressure may be maintained at about 50 mTorr, the source power may be 1000 W, and the bias power may be 40 W. About 160 sccm of HBr, about 20 to about 30 sccm of $Cl_2$, and about 8 sccm of a mixture of He and $O_2$ are provided. The duration of main etching is set to be about 8/10 of the entire etching time.

The process pressure is maintained at about 50 mTorr and the source power is 1000 W during the remaining time.

An end-point etch is performed by providing 40 W bias power, about 160 sccm of HBr, about 20 sccm of $Cl_2$, and about 8 sccm of a mixture of He and $O_2$.

Finally, the poly-SiGe layer is over-etched using gas including HBr, $Cl_2$, He, $O_2$, $N_2$, or any combination thereof. The other conditions are the same as when the end-point etch is performed except that $N_2$ is added at a flow rate of about 5 to about 10 sccm.

The gates, which are patterned according to the above-mentioned method, have negative slopes such that gate length is gradually reduced from the top of the gate toward the bottom of the gate.

Figure 5A:
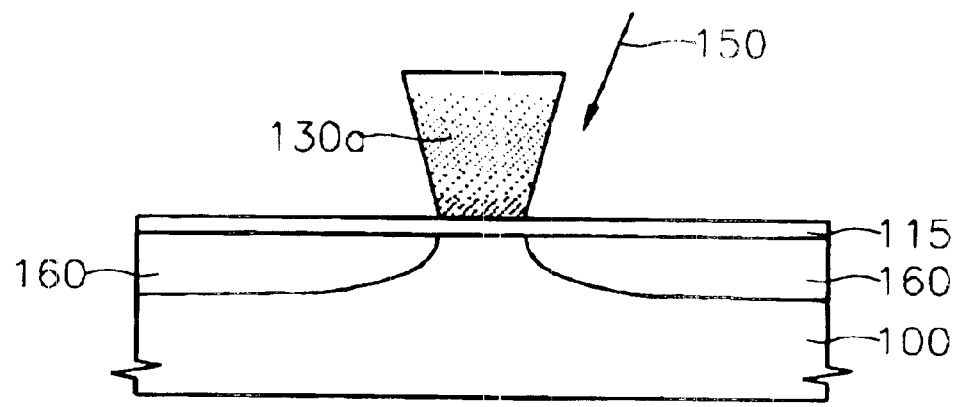
Figure 5B:
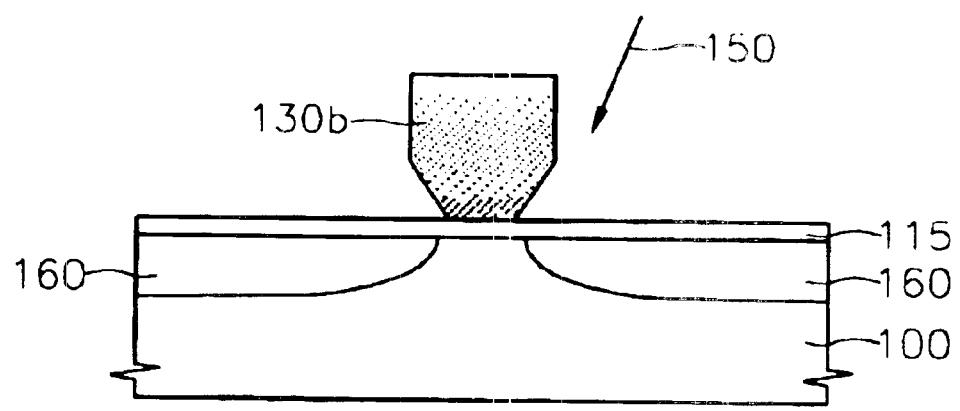

Next, referring to FIGS. 5A and 5B, the source/drain regions 160 are formed at both sides of the gates 130a and 130b on the semiconductor substrate 100 by implanting impurities 150 into the resultant structure on which the gates 130a and 130b are formed.

Figure 6A:
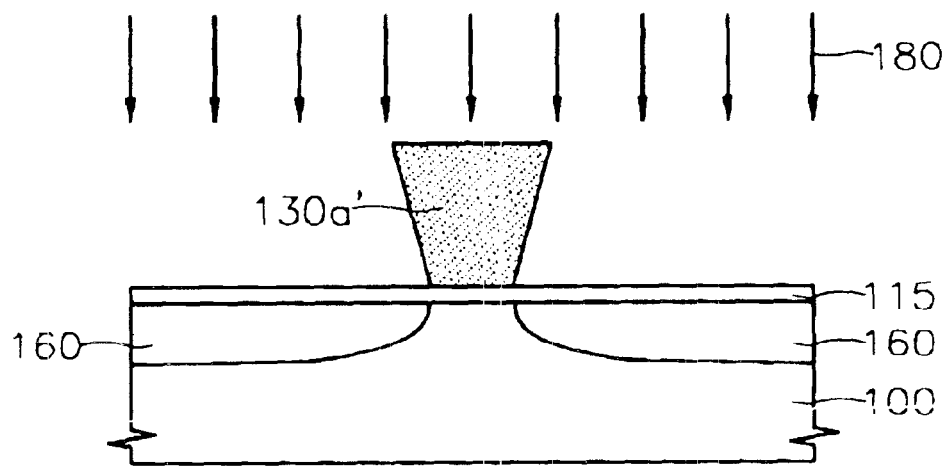
Figure 6B:
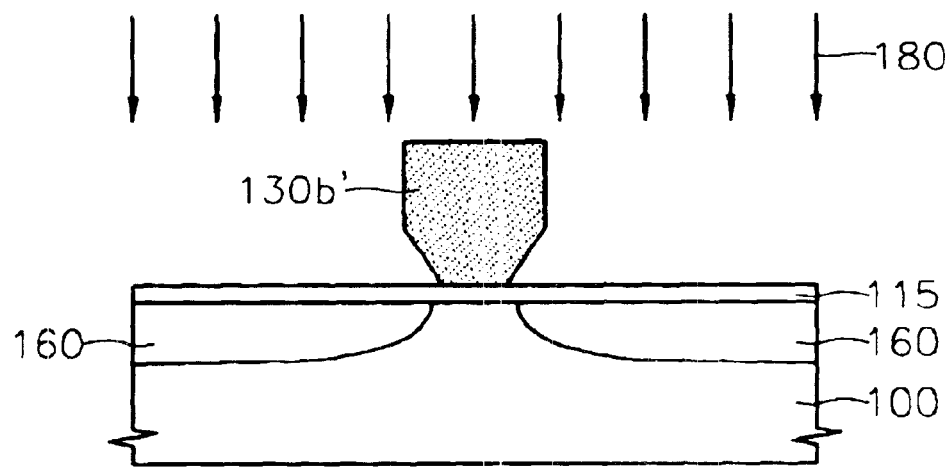

Referring to FIGS. 6A and 6B, gates 130a' and 130b' with a uniform Ge density distribution are formed by a thermal process 180, according to another aspect of the present invention. The source/drain regions 160 are extended by the thermal process 180 and the implanted ions are also activated.

However, it is preferable that the thermal process is performed before the source/drain region 160 is formed by implanting impurities 150. For example, if arsenic (As) or phosphorus (P) is used as impurities to be implanted, doping the structure having the gates 130a and 130b with a Ge density gradient with impurities is not easily performed. In addition, the characteristics of a completed device may be deteriorated. Thus, a thermal process can be performed on the gate either before or after the source/drain regions are formed, according to another aspect of the present invention.

The semiconductor device manufactured by the above-described method comprises poly-SiGe gates 130a' and 130b' formed on the semiconductor substrate 100 by interposing a gate dielectric layer 115. The gates 130a' and 130b' have negative slopes at both sides. Accordingly, the bottoms of the gates are narrower than the tops of the gates. If a gate is formed using the conditions appropriate to generate the above-described Ge density profiles, the gate bottom is narrower than the gate top by about 10 nm to about 80 nm. If a thermal process is performed, the Ge density becomes uniform throughout the gates 130a' and 130b'.

According to another aspect of the present invention, the gate having a negative slope may have a structure where the bottom of the gate is shorter than the top of the gate. In addition, it is possible to manufacture a device with a gate whose bottom is smaller than the bottom of a conventional gate that has the same length at its top and its bottom. Thus, the gate of the present invention has the advantage of relatively small gate sheet resistance.

Especially, it is possible to manufacture a gate whose bottom is narrower than its top by transforming the shape of the gate using a Ge density profile which is easily controllable. Therefore, it is possible to decrease OWV and OCV degradation due to patterning a gate with a narrow line width.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a semiconductor device comprising:

(a) forming a gate dielectric layer on a semiconductor substrate;

(b) forming a silicon seed layer on the gate dielectric layer;

(c) forming a poly-SiGe layer having a Ge density gradient, wherein the Ge density gradient is created by initially flowing Si source gas and Ge source gas on the seed layer at substantially the same time and then decreasing the amount of the Ge source gas;

(d) forming a gate whose bottom is narrower than its top, wherein the gate includes sides negatively sloping from the bottom of the gate to the top of the gate;

(e) performing a thermal process on a resultant structure on which the rate is formed to make the germanium density uniform throughout the entire gate; and (f) forming a source/drain region on the semiconductor device at both sides of the gate by implanting impurities on the resultant structure on which the gate is formed after performing the thermal process.

2. The method of claim 1, wherein the step of forming the gate further includes patterning the poly-SiGe layer using the characteristic that a portion of the poly-SiGe layer with a greater Ge density etches at a faster rate than the portion of the poly-SiGe layer with a lower Ge density.

3. The method of claim 1, wherein the seed layer is formed of polycrystalline silicon or amorphous silicon.

4. The method of claim 1, further comprising forming a silicon capping layer on the poly-SiGe layer after step (c) is completed.

5. The method of claim 1, wherein the Ge density in the poly-SiGe layer formed in step (c) is greater at the bottom of the gate than at the top of the gate and decreases linearly toward the top of the gate.

6. The method of claim 5, wherein the Ge density in the gate ranges from about 30 to about 50 at % at the bottom of the gate, and ranges from 0 to about 10 at % at the top of the gate.

7. The method of claim 1, wherein step (d) further comprises:

(d-1) pre-etching using gas including $CF_4$ and $Cl_2$;

(d-2) main-etching using gas including HBr, $Cl_2$, He and $O_2$; and (d-3) over-etching using gas HBr, $Cl_2$, He, $O_2$ and $N_2$.

8. A method for manufacturing a semiconductor device comprising:

forming a seed layer on a gate dielectric layer; and forming a poly-SiGe layer having a Ge density gradient on the seed layer, wherein the seed layer prevents Ge from gathering at the interface between the poly-SiGe layer and the seed layer;

forming a gate having sides sloping outwardly from a bottom portion of the gate to a top portion of the gate;

performing a thermal process on a resultant structure on which the gate is formed to make the germanium density uniform throughout the entire gate; and forming source/drain regions at both sides of the gate structure after performing the thermal process.

9. The method of claim 8, wherein the seed layer is formed of polycrystalline silicon or amorphous silicon.

10. The method of claim 8, wherein forming the poly Si-Ge layer having the Ge density gradient further comprises:

simultaneously flowing a Si source gas and a Ge source gas, wherein the amount of Ge source gas is gradually decreased.

11. The method of claim 8, wherein the poly Si—Ge layer having the Ge density gradient comprises a concentration of Ge greater at a bottom of the poly Si—Ge layer than at a top of the poly Si—Ge layer.

12. The method of claim 8, wherein forming the source/drain regions at both sides of the gate is performed by implanting impurities on a resultant structure on which the gate is formed.

13. The method of claim 8, wherein the step of forming the gate further comprises:

patterning the poly-SiGe layer using the characteristic that a portion of the poly-SiGe layer with a greater Ge density etches at a faster rate than the portion of the poly-SiGe layer with a lower Ge density.

14. The method of claim 8, wherein the Ge density in the poly-SiGe layer is greater at the bottom of the gate than at the top of the gate and decreases linearly toward the top of the gate.

15. The method of claim 14, wherein the Ge density in the gate ranges from about 30 to about 50 at % at the bottom of the gate, and ranges from 0 to about 10 at % at the top of the gate.

* * * * *